US011272282B2

(12) United States Patent
Malaver

(10) Patent No.: US 11,272,282 B2
(45) Date of Patent: *Mar. 8, 2022

(54) WEARABLE AUDIO DEVICE

(71) Applicant: Bose Corporation, Framingham, MA (US)

(72) Inventor: Josue Malaver, Millbury, MA (US)

(73) Assignee: Bose Corporation, Framingham, MA (US)

(*) Notice: Subject to any disclaimer, the term of this patent is extended or adjusted under 35 U.S.C. 154(b) by 323 days.

This patent is subject to a terminal disclaimer.

(21) Appl. No.: 16/426,267

(22) Filed: May 30, 2019

(65) Prior Publication Data

US 2020/0382857 A1    Dec. 3, 2020

(51) Int. Cl.
*H04R 1/10*    (2006.01)
*H04R 9/02*    (2006.01)

(52) U.S. Cl.
CPC ......... *H04R 1/1075* (2013.01); *H04R 1/1016* (2013.01); *H04R 9/025* (2013.01); *H04R 2201/10* (2013.01); *H04R 2209/022* (2013.01); *H04R 2209/024* (2013.01)

(58) Field of Classification Search
CPC .. H04R 1/1016; H04R 1/1041; H04R 1/1075; H04R 9/025; H04R 2201/10; H04R 2209/022; H04R 2209/024; G01R 33/0047; G01R 33/0076
See application file for complete search history.

(56) References Cited

U.S. PATENT DOCUMENTS

| 4,654,486 | A | * | 3/1987 | Adolph | H04R 9/025 335/301 |
| 4,956,868 | A | * | 9/1990 | Carlson | H04R 11/00 381/189 |
| 5,126,669 | A | | 6/1992 | Hones et al. | |
| 5,991,085 | A | | 11/1999 | Rallison et al. | |
| 9,141,194 | B1 | | 9/2015 | Keyes et al. | |
| 9,369,791 | B2 | | 6/2016 | Tanaka | |

(Continued)

FOREIGN PATENT DOCUMENTS

| EP | 2645750 A1 | 10/2013 |
| WO | 2013155217 A1 | 10/2013 |
| WO | 2014/090282 A1 | 6/2014 |

OTHER PUBLICATIONS

The International Search Report and the Written Opinion of the International Searching Authority dated Jun. 29, 2020 for PCT Application No. PCT/US2020/023485.

(Continued)

*Primary Examiner* — Huyen D Le
(74) *Attorney, Agent, or Firm* — Brian M. Dingman; Dingman IP Law, PC

(57) ABSTRACT

A wearable audio device with an electro-acoustic transducer for creating audio output, the electro-acoustic transducer comprising a transducer magnet that produces a transducer magnetic field, a magnetic field sensor spaced from the electro-acoustic transducer and constructed and arranged to sense the Earth's magnetic field, and a magnetic shield comprising a material with high magnetic permeability. The shield is configured to intercept at least some of the transducer magnetic field before it reaches the magnetic field sensor.

22 Claims, 6 Drawing Sheets

(56) References Cited

U.S. PATENT DOCUMENTS

| | | |
|---|---|---|
| 9,854,345 B2 | 12/2017 | Briggs |
| 9,883,280 B2 | 1/2018 | Oosato et al. |
| 9,996,162 B2 | 6/2018 | Kar et al. |
| 10,212,507 B1 | 2/2019 | Maguire et al. |
| 10,516,929 B2 | 12/2019 | Maguire et al. |
| 10,575,107 B2 | 2/2020 | So et al. |
| 10,841,716 B2 | 11/2020 | Perri et al. |
| 2005/0092919 A1 | 5/2005 | Bellec et al. |
| 2005/0111673 A1 | 5/2005 | Rosen et al. |
| 2006/0018075 A1 | 1/2006 | Schultz |
| 2006/0034478 A1 | 2/2006 | Davenport |
| 2007/0092093 A1* | 4/2007 | Shim .................. H04R 9/02 381/189 |
| 2009/0296947 A1 | 12/2009 | Duron et al. |
| 2011/0044485 A1 | 2/2011 | Lin et al. |
| 2011/0206225 A1 | 8/2011 | Moller et al. |
| 2011/0273169 A1 | 11/2011 | LaCroix |
| 2011/0291497 A1 | 12/2011 | Choi |
| 2012/0219166 A1 | 8/2012 | Ball |
| 2013/0272563 A1 | 10/2013 | Boyd |
| 2013/0329910 A1 | 12/2013 | Crosby et al. |
| 2015/0003662 A1 | 1/2015 | Vernon et al. |
| 2015/0181355 A1 | 6/2015 | Pedersen |
| 2015/0195639 A1 | 7/2015 | Azmi et al. |
| 2015/0281852 A1 | 10/2015 | Sacha |
| 2015/0326963 A1* | 11/2015 | Sorensen ............ H04R 1/1041 381/74 |
| 2015/0365755 A1 | 12/2015 | Harper |
| 2016/0057541 A1* | 2/2016 | Porter .................. H04R 9/025 381/412 |
| 2017/0014071 A1 | 1/2017 | Readdie et al. |
| 2017/0090003 A1 | 3/2017 | Guo |
| 2017/0093079 A1 | 3/2017 | Wagman et al. |
| 2017/0160086 A1 | 6/2017 | Kesaniemi |
| 2017/0208382 A1 | 7/2017 | Grinker |
| 2017/0295443 A1 | 10/2017 | Boesen |
| 2018/0070166 A1 | 3/2018 | Howell et al. |
| 2018/0088185 A1 | 3/2018 | Woods et al. |
| 2018/0096770 A1 | 4/2018 | Danielson et al. |
| 2018/0115816 A1 | 4/2018 | Panecki et al. |
| 2018/0115839 A1 | 4/2018 | Eichfeld et al. |
| 2018/0193728 A1 | 7/2018 | Bashkirov et al. |
| 2018/0211751 A1 | 7/2018 | Khoshkava et al. |
| 2019/0281376 A1 | 9/2019 | Maquire et al. |
| 2019/0281377 A1 | 9/2019 | Maguire et al. |
| 2020/0280788 A1 | 9/2020 | Maguire |
| 2020/0292633 A1* | 9/2020 | Maguire ............ G01R 33/0206 |
| 2020/0300932 A1 | 9/2020 | Maguire |
| 2020/0304895 A1 | 9/2020 | Maguire |

OTHER PUBLICATIONS

The International Search Report and The Written Opinion issued by the International Searching Authority for PCT Application No. PCT/US2020/034879 dated Sep. 3, 2020.

The International Search Report and the Written Opinion of the International Searching Authority dated Jul. 4, 2019 for PCT Application No. PCT/US2019/020914.

U.S. Appl. No. 62/626,967, filed Feb. 6, 2018; Applicant: Bose Corporation.

* cited by examiner

WEARABLE AUDIO DEVICE

BACKGROUND

This disclosure relates to a wearable audio device such as an earphone.

Wearable audio devices (e.g., earbuds and headphones) can include orientation tracking systems that use a magnetometer to track motions of the head and/or the direction in which the wearer is looking. Magnetometers need to accurately detect the Earth's magnetic field. The wearable audio device's electro-acoustic transducer typically includes a magnet. The wearable audio device can also include a magnet used to dock or park the wearable audio device to another structure. Since some wearable audio devices, such as in-ear headphones (sometimes also called earbuds) are desirably quite small, of necessity the magnetometer is close to the other magnet(s). The magnetic field of the other magnet(s) may have a magnetic field strength that is much greater than the Earth's magnetic field. Accordingly, the device's magnetic field(s) can overwhelm the magnetometer and prevent it from working properly.

SUMMARY

All examples and features mentioned below can be combined in any technically possible way.

In one aspect, a wearable audio device includes an electro-acoustic transducer for creating audio output, the electro-acoustic transducer comprising a transducer magnet that produces a transducer magnetic field, a magnetic field sensor spaced from the electro-acoustic transducer and constructed and arranged to sense the Earth's magnetic field, and a magnetic shield comprising a material with high magnetic permeability, wherein the shield is configured to intercept at least some of the transducer magnetic field before it reaches the magnetic field sensor.

Examples may include one of the above and/or below features, or any combination thereof. The wearable audio device may comprise an earbud comprising an earbud body, and the electro-acoustic transducer, the magnetic field sensor, and the shield may all be located within the earbud body. The earbud body may be constructed and arranged to be positioned so as to direct the audio output toward the ear of the wearer. The magnetic shield may be located between the transducer magnet and the magnetic field sensor. The material with high magnetic permeability may comprise mu metal. The material with high magnetic permeability may comprise a nickel-iron alloy.

Examples may include one of the above and/or below features, or any combination thereof. The wearable audio device may further comprise a housing constructed and arranged to be positioned at an ear of a wearer so as to direct the audio output toward the ear of the wearer. The transducer and the shield may be in the housing. The housing may comprise a wall between the transducer and the magnetic field sensor. The shield may be coupled to the wall. The wall may define an interior width. The shield may span the entire interior width of the wall. The shield may comprise a first portion that spans at least part of the interior width of the wall and a second portion that is located between the first portion and the transducer. The second portion of the shield may be coupled to the housing wall.

Examples may include one of the above and/or below features, or any combination thereof. The shield may be coupled to the transducer. The shield may be coupled to the transducer proximate the transducer magnet. The shield may comprise openings to allow sound pressure from the transducer to pass through the shield. The transducer magnet may have a magnetic field strength and the magnetic field sensor may have a sensed magnetic field range where it operates linearly. The shield may reduce the strength of the transducer magnetic field at the magnetic field sensor such that the sensed magnetic field strength is in the sensed magnetic field range where the magnetic field sensor operates linearly.

In another aspect an earbud includes an electro-acoustic transducer for creating audio output, the electro-acoustic transducer comprising a transducer magnet that produces a transducer magnetic field having a magnetic field strength, a body constructed and arranged to be positioned at an ear of a wearer so as to direct the audio output at the ear of the wearer, a three-axis magnetometer positioned in the body and constructed and arranged to sense the Earth's magnetic field in three orthogonal axes, and a magnetic field shield positioned in the body between the transducer and the magnetometer and configured to intercept the transducer magnetic field before it reaches the magnetometer. The magnetometer may have a sensed magnetic field range where it operates linearly, and the shield may reduce the strength of the transducer magnetic field at the magnetometer such that the sensed magnetic field strength is in the sensed magnetic field range where the magnetometer operates linearly. In one non-limiting example, the transducer, the magnetometer, and the shield are all located within the body.

DETAILED DESCRIPTION

Wearable audio devices (one non-limiting example being earphones) can include a transducer magnet. Some but not all wearable audio devices also include one or both of a docking magnet and a parking magnet. Wearable audio devices many times include magnetic devices, for example a magnetometer, ferrite cores (which may be used in filters, for example), and magnetic reed switches, to name only several of many possible magnetic devices in a wearable audio device such as an earbud. These magnetic devices are typically designed to operate in a stable operational range only if the strength of any stray magnetic field is relatively low. The magnets of a wearable audio device can emit stray magnetic fields that can negatively impact the operation of other magnetic devices of the wearable audio device.

When wearable audio devices (e.g., earphones) include a magnetometer, the magnetometer can be located close to the transducer magnet and/or other magnets. The magnetic field from any one or more of these magnets can overwhelm the magnetometer and prevent it from properly detecting the strength of the Earth's magnetic field.

Negative effects on a magnetic device of a wearable audio device due to stray magnetic fields at the location of the magnetic device can be reduced with a magnetic shield comprising a material with high magnetic permeability. The shield is configured to intercept at least some of the stray magnetic field(s) before they reach the magnetic device, so that the stray magnetic field(s) at the location of the magnetic device are eliminated or reduced. Any shielding should be sufficient such that the magnetic device can operate in its operational region where stray magnetic field(s) do not overwhelm it. For example, when the magnetic device is a magnetometer, one or more magnetic shields can be used to bring the magnetometer into a region of stable operation where the magnetometer can operate in its operational region where stray magnetic fields do not overwhelm the Earth's magnetic field.

Figure 1:
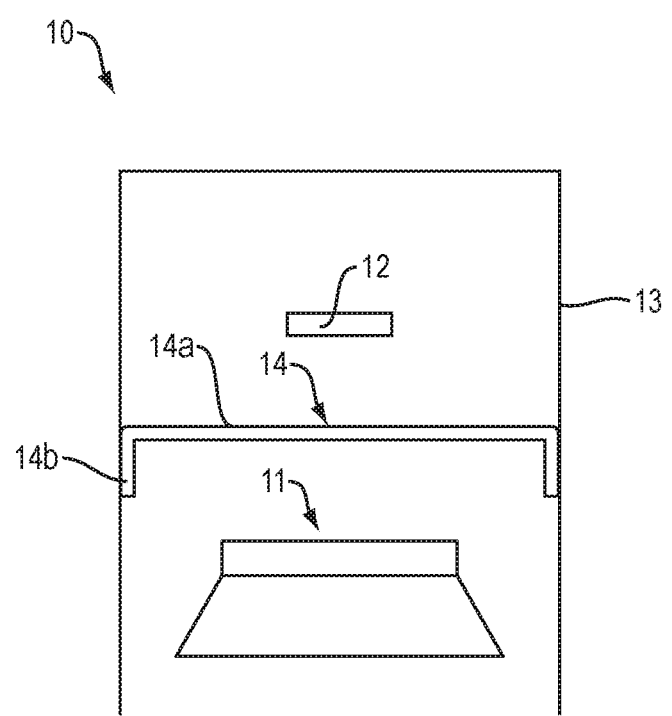
FIG. 1 is a schematic cross-sectional view of a wearable audio device.

FIG. 1 is a schematic cross-sectional view of a wearable audio device 10 that comprises an electro-acoustic transducer 11 that is configured to create audio output. Electro-acoustic transducer 11 includes a transducer magnet (not shown) that produces a transducer magnetic field. Magnetic field sensor 12 is spaced from transducer 11 and is constructed and arranged to sense the Earth's magnetic field. Magnetic shield 14 comprises a material with high magnetic permeability and is configured to intercept at least some of the transducer magnetic field before it reaches the magnetic field sensor. The transducer, the magnetic field sensor and the shield are all located within device housing 13. In one non-limiting example device 10 is an earbud and housing 13 is an earbud body. The earbud body may be constructed and arranged to be positioned so as to direct the transducer audio output toward the ear of the wearer.

The magnetic shield 14 is located between the transducer magnet and the magnetic field sensor, such that it intercepts some or all of the magnetic field from the transducer magnet before the field reaches the sensor. Shield 14 is made from or at least includes a material with high magnetic permeability. Without limiting the scope of this disclosure, high permeability can be defined as a DC permeability of at least about 1,000. Highly permeable materials are able to support the formation of a magnetic field within the material. Accordingly, when such materials are placed in a magnetic field the field couples to the material. The material thus can be considered to intercept the field. Since the shield is located between the source(s) of stray field(s) and the sensor, the shield intercepts the field(s) before they reach the sensor and so reduces (or perhaps eliminates) the stray field(s) at the location of the sensor. In one non-limiting example shield 14 comprises or is made from mu metal. Mu metal is a known ferromagnetic alloy with high magnetic permeability (typically between about 1,000 and 500,000) and comprises a nickel-iron alloy. Mu metal is soft, so it can be easily formed to a desired shape. Ferrite or other magnetically permeable materials may be used as part of or all of the shield.

Housing 13 may be but need not be constructed and arranged to be positioned at an ear of a wearer so as to direct the audio output toward the ear of the wearer. Housing 13 has an outer wall located between transducer 11 and magnetic field sensor 12. Shield 14 can be coupled to the wall, as shown. In this non-limiting example the wall defines an interior width and shield 14 spans the entire interior width of the wall. Shield 14 comprises a first portion 14a that spans at least part of (and in this case all of) the interior width of the wall at a location spaced from the transducer, and a second portion 14b that is located between the first portion and the transducer. The second portion 14b is coupled to the housing wall. Coupling can be accomplished in any manner, such as by the use of an adhesive or mechanical coupling members such as hooks or fasteners.

Shield 14 can be unitary (one piece) or can comprise two or more separate pieces. The shield is positioned to sufficiently intercept the stray fields before they reach sensor 12 such sensor 12 can operate in its stable operational region where it is able to sense the Earth's magnetic field. In cases where the stray field comes from the transducer magnet, the shield will ideally be located as close to as possible to the transducer magnet, so its field is intercepted before it begins to spread out too far to be intercepted. The shield can be (but need not be) coupled to the transducer. If it is, it needs to be configured such that it does not unacceptably interfere with the transducer function. For example, if the shield is coupled to the rear side of the transducer, it may need to have openings so that sound pressure can pass through the shield.

Figure 2:
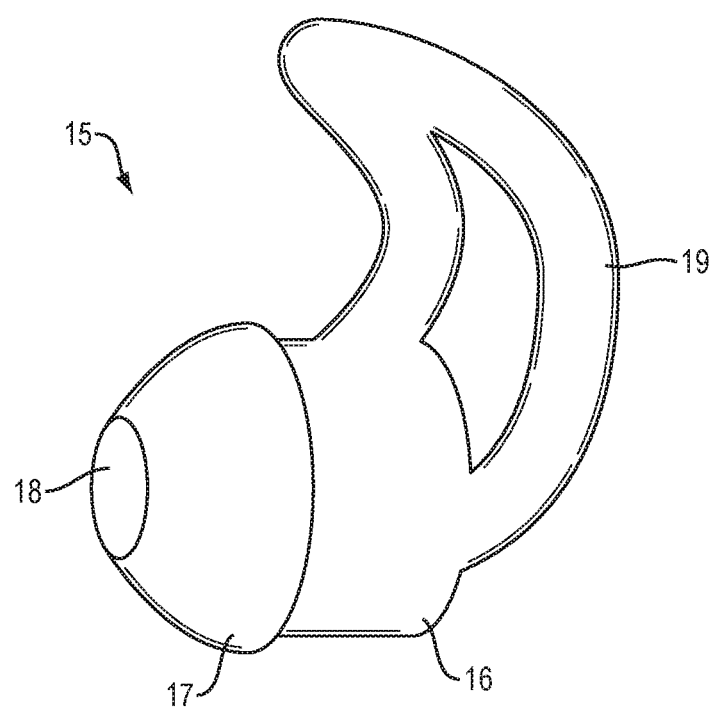
FIG. 2 is perspective view of an earphone.

FIG. 2 is a perspective view of a wireless in-ear headphone, earphone, or earbud, 15. An earphone is only one non-limiting example of the subject wearable audio device. Other examples are described elsewhere herein. Earbud/earphone 15 includes body or housing 16 that houses the active components of the earbud. Portion 17 is coupled to body 16 and is pliable so that it can be inserted into the entrance of the ear canal. Sound is delivered through opening 18. Retaining loop 19 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference for all purposes), and so certain details of the earbud are not further described herein. An earbud 15 is an example of a wearable audio device according to this disclosure, but is not limiting of the scope of this disclosure as stray magnetic fields from one or more magnets at the location of a magnetic device in other types of wearable audio devices can also be resolved in accordance with the present disclosure.

Figure 3:
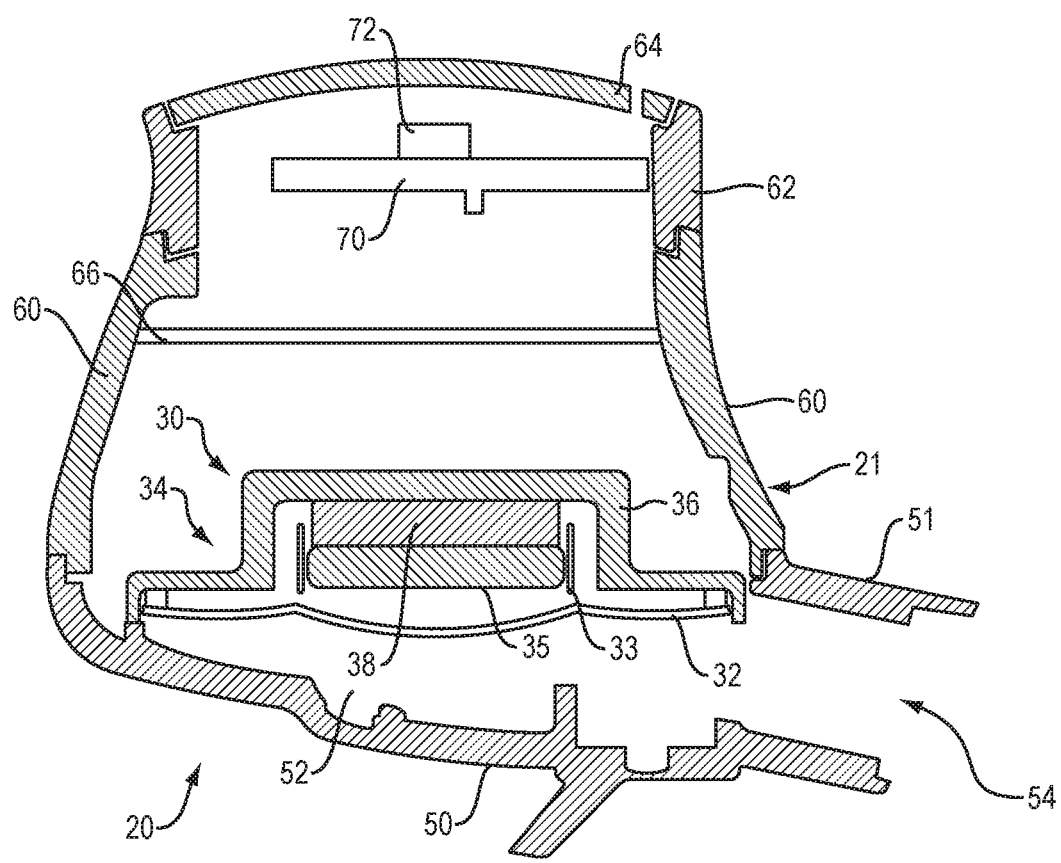
FIG. 3 is a partial cross-sectional view of elements of an earphone.

FIG. 3 is a partial cross-sectional view of only certain elements of an earphone 20 that are useful to a better understanding of the present disclosure. Earphone 20 comprises housing 21 that encloses electro-acoustic transducer 30. Housing 21 comprises front housing portion 50 and rear housing portions 60 and 62. Transducer 30 has diaphragm 32 that is driven in order to create sound pressure in front acoustic cavity 52. Sound pressure is directed out of front housing portion 50 via opening 54. When earphone 20 is an earbud, as shown by earbud 15 in FIG. 2, there is typically a pliable tip (not shown) that is engaged with neck 51 of housing portion 50, to help direct the sound into the ear canal and to seal to the ear canal opening. Earphone housing 21 further comprises a rear enclosure made from rear housing portions 60 and 62, and grille 64. Note that the details of earphone 20 are exemplary of aspects of earphones and are not limiting of the scope of this disclosure, as the present magnetic field reduction at the location of the magnetometer or other magnetic device can be used in varied types and designs of earphones and other wearable audio devices.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field.

Three-axis magnetometer 72 is mounted on PCB 70 and is arranged to sense the strength of magnetic fields in three axes at the location of the magnetometer, as is known in the field. Magnetometer 72 is configured to detect the Earth's magnetic field. The output of magnetometer 72 can be used to determine the direction in which the wearer's head is pointed, as described in U.S. Patent Application 62/626,967, filed on Feb. 6, 2018, the entire disclosure of which is incorporated herein by reference. As discussed above, earphone 20 may additionally or alternatively include other magnetic devices that might be adversely impacted by the stray magnetic field from a transducer, coupling, docking and/or parking magnet.

Since magnetometer 72 is relatively close to transducer magnet 38 (in a wireless earbud magnetometer 72 and transducer magnet 38 may be separated by only about 2 mm) the transducer's magnetic field can overwhelm the magnetometer and prevent it from properly detecting the strength of the Earth's magnetic field. The magnetometer can be brought into its specified measurement range (where stray magnetic fields do not overwhelm or skew the desired measurement) with a magnetic shield comprising a material with high magnetic permeability, wherein the shield is configured to intercept at least some of the transducer magnetic field before it reaches the magnetic field sensor. Magnetic shield 66 is in this non-limiting example coupled to the inside of housing 60 and spans the entire width of the housing.

Shield 66 is located such that it intercepts at least some of the magnetic field from transducer magnet 38 before the field reaches magnetometer 72, and so partially or fully reduces the transducer magnetic field at the location of magnetometer 72. This transducer magnetic field reduction should take place in any one, two, or three of the three orthogonal sense axes in which stable operation of the magnetometer is needed. In the present case, stable magnetometer results are desired in all three axes, so shield 66 is desirably configured to sufficiently reduce the magnetic field of transducer magnet 38 in all three axes. It should be understood that the location of shield 66 in FIG. 3 is representative, and shield 66 may actually be located elsewhere in the wearable audio device, somewhere between the transducer and the magnetometer. In the present example, shield 66 is located in housing 60 proximate or against the outside of the transducer magnetic structure (which in this non-limiting example comprises cup 36). The shielding should be sufficient such that magnetometer 72 can operate in at least one sense axis in its operational region where stray magnetic fields do not overwhelm the Earth's magnetic field to the point where the Earth's magnetic field can't be properly sensed. Linear operation of magnetometers (where there are stray magnetic fields that are not so strong that they overwhelm sensing or detection of the desired field) is known in the technical field, and so is not further described herein. Alternatively, rather than fully canceling or reducing the field along all three orthogonal sense axes, shield 66 can reduce the magnitude of the transducer magnet's field at magnetometer 72 along only one orthogonal axis, or along two orthogonal axes, ideally to the point where the magnetometer can properly detect the Earth's magnetic field.

The configuration, location, and shielding properties of shield 66 can be determined in one non-limiting example as follows. Magnetic fields have both a direction and magnitude. Once the direction and magnitude of the field from transducer magnet 38 (and any other magnets that may have an effect on the magnetometer) at the magnetometer are known, a shield can be chosen and its location and other properties (e.g., its magnetic permeability, thickness, size, shape) determined such that (at the necessary location(s) of the magnetometer where the fields in each axis are sensed), the stray magnetic field(s) at the location of magnetometer 72 are reduced or eliminated in all three axes.

Figure 4:
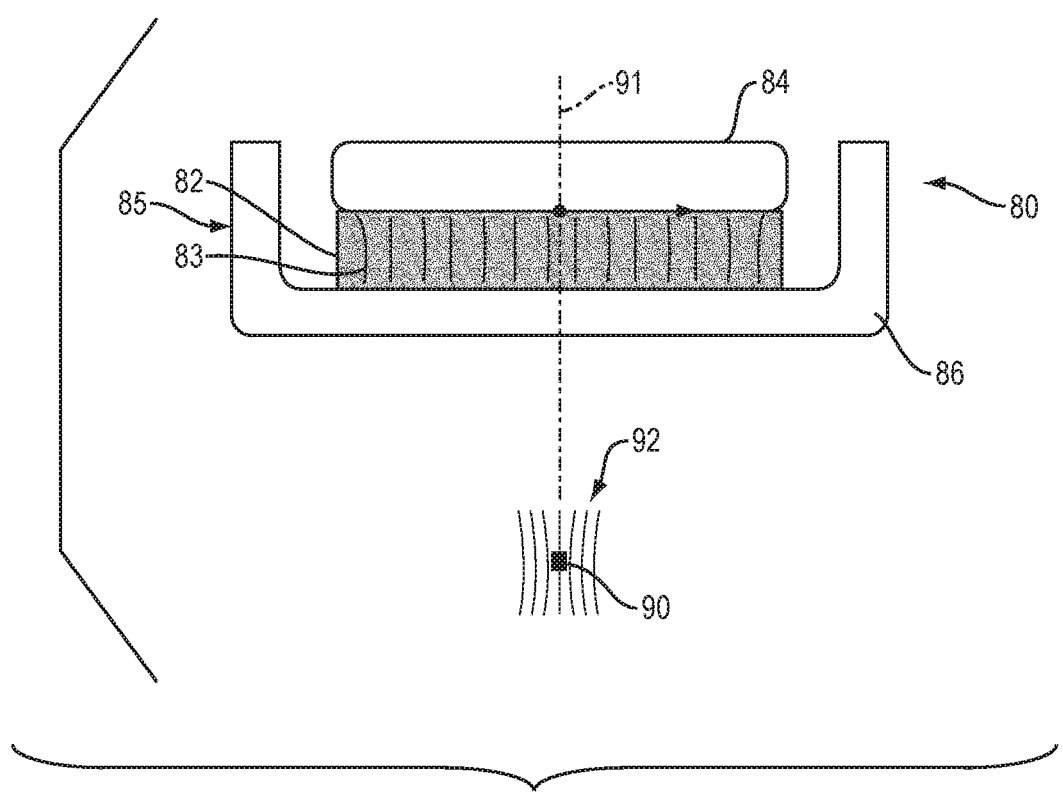
FIG. 4 is a schematic view of the magnetic structure of an earphone and its magnetic field at the location of a magnetic field sensor.
Figure 5:
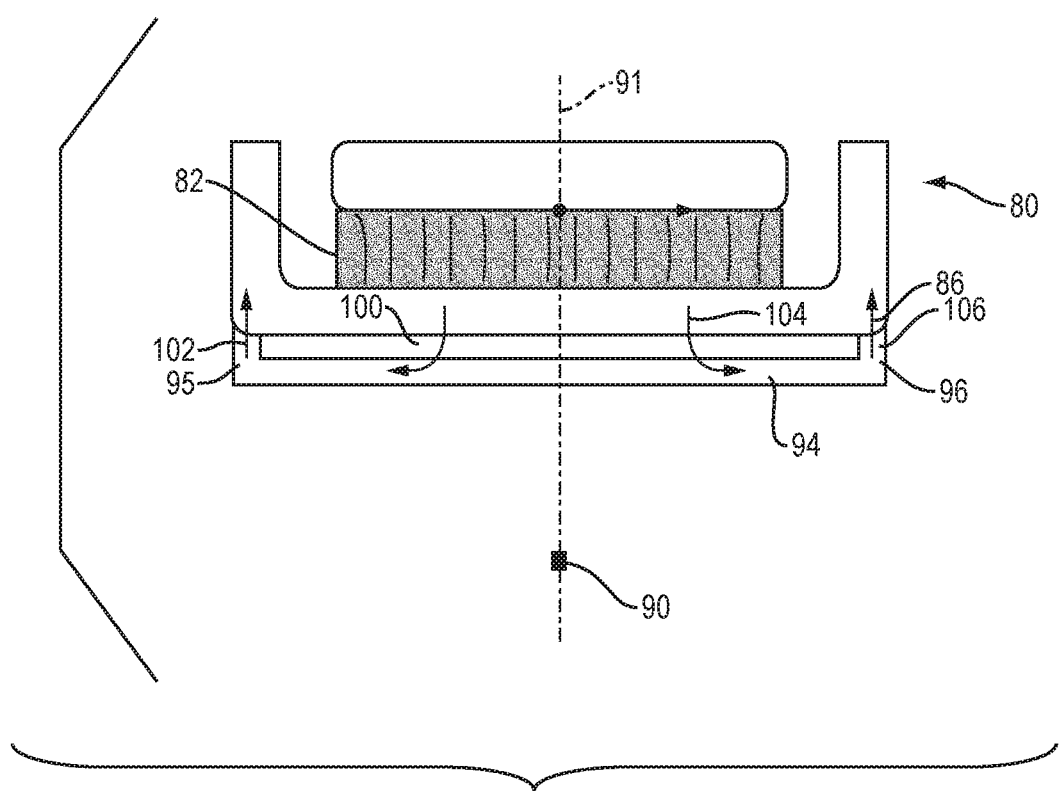
FIG. 5 is a view similar to that of FIG. 4 but including a magnetic field shield.

FIGS. 4 and 5 illustrate aspects of an earphone. Earphone electro-acoustic transducer 80 comprises transducer magnet 82, and a magnetic structure 85 that comprises cup 86 and front member 84. Magnet 82 has a magnetic field, which is represented by the generally vertical field line representations 83. Magnetic fields and field line representations are well known in the art and so are not further described herein. The field from magnet 83 in the vicinity of magnetometer 90 is schematically represented by field lines 92. In the example, the field strength of the magnetic field from magnet 82 in the vicinity of magnetometer 90 is about 500 µT. Note that the field strength is unlikely to be the same in each of the three axes. The 500 µT value is simply representative of what the field strength may be in any one or more of the three axes. In contrast, the strength of the Earth's magnetic field is generally approximately 50 µT, or about $\frac{1}{10}^{th}$ of the field from magnet 82. With a stray field such as this that overwhelms the field to be sensed, magnetometer 90 can be inaccurate. Accordingly, the look direction sensing involving magnetometer 90 can be inaccurate. It should be understood that electro-acoustic magnet transducers can have varied shapes, sizes, locations, and field strengths, and that the illustrative values set forth in the examples are not limiting of the scope of this disclosure.

FIG. 5 illustrates schematically an effect of shield 94. Shield 94 is located between the outside of cup 86 and magnetometer 90. Shield 94 has a size, shape, orientation, magnetic permeability, and location relative to transducer 80 and magnetometer 90 such that it intercepts the magnetic field from the transducer magnet 82 sufficiently to fully or partially prevent the transducer magnetic field from reaching the magnetometer in one, two, or three orthogonal axes. In this non-limiting example, this field cancellation is indicated by there being no field line representation at magnetometer 90 (i.e., no field lines intersect magnetometer 90).

Shield 94 is in this non-limiting example coupled to cup 86 via peripheral portions 95 and 96. This places the shield very close to the source of the stray magnetic field—the transducer magnet. The shield can thus be effective to intercept and redirect the magnetic field before it reaches the magnetometer. The stray field from magnet 82 is indicated by field lines 100 and 104 that are redirected into shield 94 and out of the shield back toward the magnet as indicated by return field lines 102 and 106. Accordingly, the field does not reach magnetometer 90. Since the shield can help to couple the field back to the transducer magnet, the shield may increase the efficiency of the magnet and thus of the transducer. Note that the drawing is schematic and the actual configuration of the shield and the manner in which it is coupled to the cup or to another portion of the transducer (possibly close to the cup) may depend on the particular transducer used. If the shield seals the back of the transducer, it may be desirable to include openings (not shown) that allow sound pressure to pass through the shield. Also, it may be possible to shield a transducer magnet by making the basket or frame of the transducer from a material with high magnetic permeability.

Note that the field that is intercepted could be from the transducer magnet and/or from a parking or docking magnet. The shielding should be sufficient to reduce the stray magnetic field(s) to below the level where the magnetometer can operate in its normal operational range. The strength of stray fields that would bring a magnetometer out of its normal operational range are dependent on the particular magnetometer used.

It should be understood that the field does not need to be fully canceled by the shield. Rather, as described above, the strength of the field needs to be reduced sufficiently such that the magnetometer can sense the Earth's magnetic field. The reduction in the transducer field at the magnetometer that needs to be accomplished with a shield will in part depend on the particular magnetometer used, as would be apparent to one skilled in the field.

Also, it should be understood that magnetic fields are three-dimensional, while FIGS. 4 and 5 are two-dimensional. Those skilled in the field will understand the extent to which the transducer magnet's field in three dimensions needs to be reduced in order for the sensing of the Earth's magnetic field to be accomplished with sufficient accuracy for the particular application of the Earth's magnetic field sensor, and can make an appropriate selection of the shield parameters described above to accomplish such results.

In one non-limiting example, transducer magnet 82 can be a generally cylindrical magnet with a diameter of about 8 mm, and cup 86 can have a diameter of about 10 mm. In one non-limiting example, sensor 90 can be positioned less than about 10 mm from transducer 80. In one non-limiting example, the magnetic field strength of the transducer magnet at sensor 90 is at least about 100 µT. In one non-limiting example the magnetic field strength outside of transducer 80 is as high as $1 \times 10^{-9}$ T. With a shield 94 made of mu metal, shield 94 can be effective to reduce the magnetic field to about $4 \times 10^{-11}$ T. Note that all values are illustrative rather than limiting of the scope of this disclosure.

Figure 6:
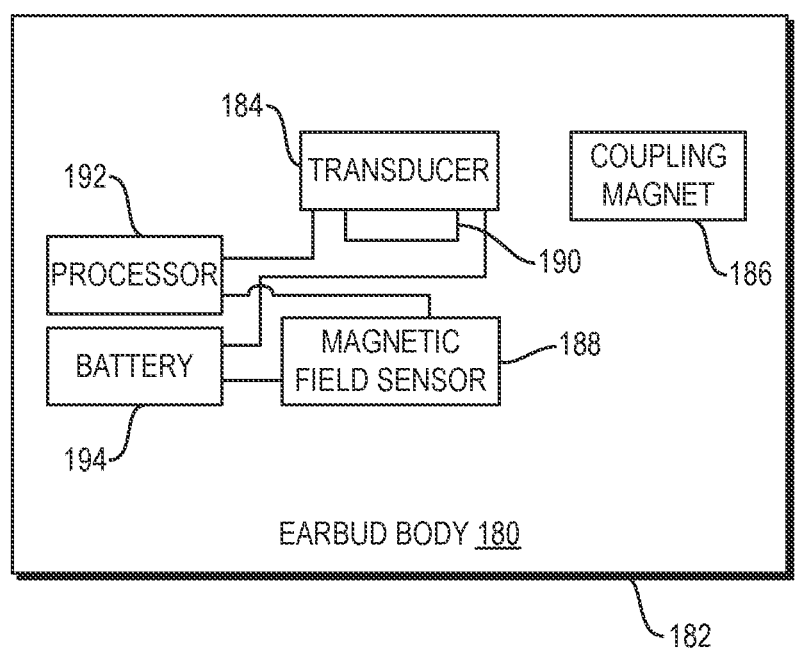
FIG. 6 is a schematic diagram of an earphone.

FIG. 6 is a schematic diagram of in-ear headphone 182, illustrating in part an additional coupling or parking magnet 186. The described components can be located in earbud body 180. Battery 194 provides power to powered components. Processor 182 is used, in part, to drive transducer 184. Processor 192 is also used to determine the wearer's look direction, in part using the output of magnetic field sensor 188. It should be understood that earphones will likely have more components and can have different components than those shown in FIG. 6. Some earphones include one or more magnets other than the transducer magnet. One such other magnet is represented in this non-limiting example by coupling or parking magnet 186. Coupling or parking magnet 186 can be used to couple or park earphone 182 to another structure. As one non-limiting example, magnet 186 can be used to "dock" an earbud to a battery charger. As another non-limiting example, magnet 186 can be used to park an earbud to another structure, such as a neckband or another earbud. Other uses of coupling and/or parking magnets are known in the field and are included within the scope of the present disclosure.

All of the magnets in earbud body 180 of earphone 182 create magnetic fields that can adversely impact the accuracy of the sensing of the Earth's magnetic field by sensor 188, as described above. Magnetic field shield 190 is included. By proper sizing, shaping, orientation and placement of shield 190, the magnetic field from transducer 184 (and from additional magnet 186 when it is present) at sensor 188 can be reduced such that sensor 188 can detect the Earth's magnetic field, as described above.

One or more of the above described systems and methods, in various examples and combinations, may be used in a wide variety of audio systems, including wearable audio devices in various form factors. Unless specified otherwise, the term wearable audio device, as used in this document, includes headphones and various other types of personal audio devices such as head, shoulder or body-worn acoustic devices (e.g., audio eyeglasses or other head-mounted audio devices) that include one more acoustic transducers to receive and/or produce sound, with or without contacting the ears of a user. It should be noted that although specific implementations of speaker systems primarily serving the purpose of acoustically outputting audio are presented with some degree of detail, such presentations of specific implementations are intended to facilitate understanding through provisions of examples and should not be taken as limiting either the scope of disclosure or the scope of claim coverage.

Elements of FIG. 6 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

The example of FIG. 6 comprises a processor that is configured to use computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:
1. A wearable audio device, comprising:
an electro-acoustic transducer for creating audio output, the electro-acoustic transducer comprising a transducer magnet that produces a transducer magnetic field;

a magnetic field sensor spaced from the electro-acoustic transducer and constructed and arranged to sense the Earth's magnetic field; and a magnetic shield comprising a material with high magnetic permeability, wherein the shield is configured to intercept at least some of the transducer magnetic field before it reaches the magnetic field sensor;

wherein the transducer magnet has a magnetic field strength and the magnetic field sensor has a sensed magnetic field range where it operates linearly, and wherein the shield reduces the strength of the transducer magnetic field at the magnetic field sensor such that the sensed magnetic field strength is in the sensed magnetic field range where the magnetic field sensor operates linearly.

2. The wearable audio device of claim 1, comprising an earbud comprising an earbud body, and wherein the electro-acoustic transducer, the magnetic field sensor, and the shield are all located within the earbud body.

3. The wearable audio device of claim 2, wherein the earbud body is constructed and arranged to be positioned so as to direct the audio output toward the ear of the wearer.

4. The wearable audio device of claim 1, wherein the magnetic shield is located between the transducer magnet and the magnetic field sensor.

5. The wearable audio device of claim 1, wherein the material with high magnetic permeability comprises mu metal.

6. The wearable audio device of claim 1, wherein the material with high magnetic permeability comprises a nickel-iron alloy.

7. The wearable audio device of claim 1, further comprising a housing constructed and arranged to be positioned at an ear of a wearer so as to direct the audio output toward the ear of the wearer.

8. The wearable audio device of claim 7, wherein the transducer and the shield are in the housing.

9. The wearable audio device of claim 8, wherein the housing comprises a wall between the transducer and the magnetic field sensor.

10. The wearable audio device of claim 9, wherein the shield is coupled to the wall.

11. The wearable audio device of claim 9, wherein the wall defines an interior width.

12. The wearable audio device of claim 11, wherein the shield spans the entire interior width of the wall.

13. The wearable audio device of claim 11, wherein the shield comprises a first portion that spans at least part of the interior width of the wall and a second portion that is located between the first portion and the transducer.

14. The wearable audio device of claim 13, wherein the second portion of the shield is coupled to the housing wall.

15. The wearable audio device of claim 1, wherein the shield is coupled to the transducer.

16. The wearable audio device of claim 15, wherein the shield is coupled to the transducer proximate the transducer magnet.

17. The wearable audio device of claim 16, wherein the shield comprises openings to allow sound pressure from the transducer to pass through the shield.

18. An earbud, comprising:
an electro-acoustic transducer for creating audio output, the electro-acoustic transducer comprising a transducer magnet that produces a transducer magnetic field having a magnetic field strength;

a body constructed and arranged to be positioned at an ear of a wearer so as to direct the audio output at the ear of the wearer;

a three-axis magnetometer positioned in the body and constructed and arranged to sense the Earth's magnetic field in three orthogonal axes; and a magnetic field shield positioned in the body between the transducer and the magnetometer and configured to intercept the transducer magnetic field before it reaches the magnetometer;

wherein the magnetometer has a sensed magnetic field range where it operates linearly, and wherein the shield reduces the strength of the transducer magnetic field at the magnetometer such that the sensed magnetic field strength is in the sensed magnetic field range where the magnetometer operates linearly.

19. The earbud of claim 18, wherein the electro-acoustic transducer, the magnetometer, and the shield are all located within the body.

20. A wearable audio device, comprising:
an electro-acoustic transducer for creating audio output, the electro-acoustic transducer comprising a transducer magnet that produces a transducer magnetic field;

a magnetic field sensor spaced from the electro-acoustic transducer and constructed and arranged to sense the Earth's magnetic field;

a magnetic shield comprising a material with high magnetic permeability, wherein the shield is configured to intercept at least some of the transducer magnetic field before it reaches the magnetic field sensor; and a housing constructed and arranged to be positioned at an ear of a wearer so as to direct the audio output toward the ear of the wearer, wherein the transducer and the shield are in the housing, the housing comprises a wall between the transducer and the magnetic field sensor, and the shield is coupled to the wall.

21. A wearable audio device, comprising:
an electro-acoustic transducer for creating audio output, the electro-acoustic transducer comprising a transducer magnet that produces a transducer magnetic field;

a magnetic field sensor spaced from the electro-acoustic transducer and constructed and arranged to sense the Earth's magnetic field;

a magnetic shield comprising a material with high magnetic permeability, wherein the shield is configured to intercept at least some of the transducer magnetic field before it reaches the magnetic field sensor; and a housing constructed and arranged to be positioned at an ear of a wearer so as to direct the audio output toward the ear of the wearer, wherein the transducer and the shield are in the housing, the housing comprises a wall between the transducer and the magnetic field sensor and that defines an interior width, and wherein the shield spans the entire interior width of the wall.

22. A wearable audio device, comprising:
an electro-acoustic transducer for creating audio output, the electro-acoustic transducer comprising a transducer magnet that produces a transducer magnetic field;

a magnetic field sensor spaced from the electro-acoustic transducer and constructed and arranged to sense the Earth's magnetic field;

a magnetic shield comprising a material with high magnetic permeability, wherein the shield is configured to intercept at least some of the transducer magnetic field before it reaches the magnetic field sensor; and a housing constructed and arranged to be positioned at an ear of a wearer so as to direct the audio output toward the ear of the wearer, wherein the transducer and the shield are in the housing, the housing comprises a wall between the transducer and the magnetic field sensor and that defines an interior width, and the shield comprises a first portion that spans at least part of the interior width of the wall and a second portion that is located between the first portion and the transducer.

* * * * *